US009040332B2

(12) United States Patent
Moran et al.

(10) Patent No.: US 9,040,332 B2
(45) Date of Patent: May 26, 2015

(54) HIGHLY REFLECTIVE COATING ON LED SUBMOUNT (75) Inventors: Brendan Moran, San Jose, CA (US); Jeffrey Kmetec, Palo Alto, CA (US); Iain Black, San Jose, CA (US); Frederic Diana, Santa Clara, CA (US); Serge Laurent Rudaz, Sunnyvale, CA (US); Li Zhang, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/878,782

(22) PCT Filed: Oct. 7, 2011

(86) PCT No.: PCT/IB2011/054419
§ 371 (c)(1),
(2), (4) Date: May 22, 2013

(87) PCT Pub. No.: WO2012/049600
PCT Pub. Date: Apr. 19, 2012

(65) Prior Publication Data
US 2013/0248913 A1    Sep. 26, 2013

Related U.S. Application Data (60) Provisional application No. 61/392,378, filed on Oct. 12, 2010.

(51) Int. Cl.
*H01L 33/08*    (2010.01)
*H01L 33/60*    (2010.01)
*H01L 33/50*    (2010.01)
*H01L 33/62*    (2010.01)

(52) U.S. Cl.
CPC ............ *H01L 33/60* (2013.01); *H01L 33/62* (2013.01); *H01L 33/50* (2013.01); *H01L 2924/0002* (2013.01)

(58) Field of Classification Search
CPC ............................... H01L 33/40; H01L 21/20
USPC ............................................................. 257/99
See application file for complete search history.

(56) References Cited

U.S. PATENT DOCUMENTS

| | | | |
|---|---|---|---|
| 2002/0187571 A1* | 12/2002 | Collins et al. | 438/29 |
| 2008/0062701 A1 | 3/2008 | Harrah et al. | |
| 2009/0309126 A1* | 12/2009 | Okuno | 257/103 |
| 2010/0038655 A1 | 2/2010 | Chen et al. | |
| 2011/0012149 A1* | 1/2011 | Basin et al. | 257/98 |
| 2012/0061698 A1* | 3/2012 | Toscano et al. | 257/88 |

FOREIGN PATENT DOCUMENTS

EP    1434271 A2 *    6/2004    ............. H01L 27/15

* cited by examiner

*Primary Examiner* — Colleen A Matthews
*Assistant Examiner* — William Harriston (57) ABSTRACT A submount for a light emitting stack includes a substrate and a metallization layer having circuit traces and a planar dielectric layer that fills regions between the circuit traces. The planar dielectric layer serves to minimize the amount of light lost/absorbed by the substrate and preferably reflects the internally reflected light back toward the desired light output element. To facilitate efficient manufacture, a dielectric paste is applied over the metallized layer, then planed to expose at least portions of the metal conductors for the subsequent coupling to the light emitting stack. Pedestal elements are preferably provided at select locations on the circuit traces to facilitate this coupling while allowing the remainder of the circuit traces to be covered with the dielectric layer.

21 Claims, 5 Drawing Sheets

[PRIOR ART]

HIGHLY REFLECTIVE COATING ON LED SUBMOUNT

BACKGROUND AND SUMMARY OF THE INVENTION

This invention relates to the field of light emitting devices, and in particular to a light emitting device with improved efficiency by providing a highly reflective coating on the substrate that supports the light emitting device.

The need for energy efficient illumination has accelerated the demand for efficient light emitting devices, particularly in view of the fact that solid state light emitting devices are now able to provide white light by mixing light of multiple wavelengths.

In a typical solid state multiple wavelength light emitting device, an active element of a light emitting structure provides light of a first wavelength, and a wavelength conversion element converts some of this light into light of a second wavelength. The wavelengths provided by the light of the light emitting element and the wavelength conversion elements, and the proportions of each, are designed/selected so as to produce a desired combination of these lights, such as a white light at a desired color temperature (CCT).

Figure 1A:
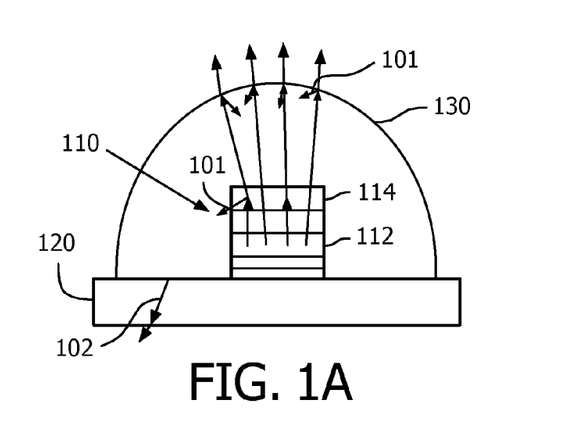
FIGS. 1A-1D illustrate example prior art light emitting devices.

FIG. 1A illustrates a conventional structure of a multi-wavelength light emitting device. The device comprises a stack of elements 110, which includes an active element 112 that emits light of a first wavelength, and a wavelength conversion element 114, typically comprising a phosphor, that converts some of light at the first wavelength to light of a second wavelength. The materials of the elements 112 and 114 are selected so as to provide desired light output characteristics based on a mix of the light of the two wavelengths. The stack 110 is built upon a substrate 120, which is typically a ceramic, such as alumina, and encapsulated by an optical element 130.

Although most of the emitted and converted light is output from the optical element 130, some of the light 101 is internally reflected or otherwise misdirected, resulting in a loss of efficiency. In most lighting applicants, the desired light output is toward a particular direction, and reflectors are used to re-direct light toward that direction. A technique commonly used to direct the light output of an LED is to include the LED chip within a reflector cup. However, with the advent of die on ceramic (DoC) LED packaging, the use of a reflector cup is not generally economically viable.

Figure 1B:
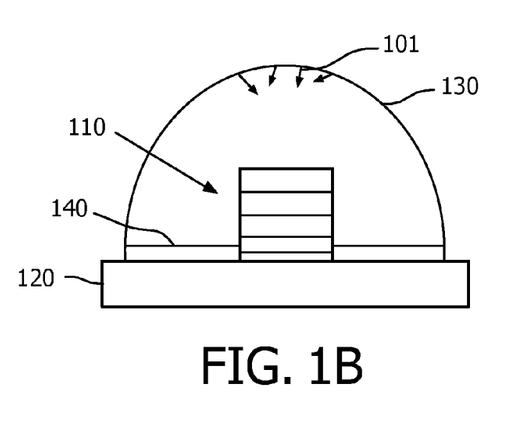

A number of techniques have been proposed for increasing the efficiency of a light emitting device on a substrate. U.S. Patent Application 2010/0038655, "REFLECTIVE LAYER FOR LIGHT EMITTING DIODES", filed 13 Nov. 2008 for Chen et al., for example, discloses the placement of a reflective layer 140 upon the substrate and adjacent the stack 101, as illustrated in FIG. 1B. In this manner, the internally reflected light 101 is reflected back up to the lens element 130, thereby potentially reducing the loss of efficiency caused by this internally reflected light 101. However, at least a portion of the light 101 that is reflected into the stack 110 is likely to be absorbed by either the elements of the stack 110 or the substrate 120.

Figure 1C:
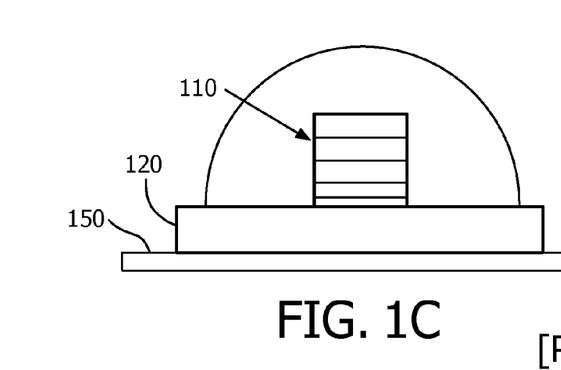

As illustrated in FIG. 1C, if the substrate 120 is transparent, or semi-transparent, a reflective layer 150 can by positioned below the substrate 120 so as to reflect any light (102 of FIG. 1A) that would otherwise escape through the substrate 120. However, because most substrates 120 are not transparent per se, some light will be lost/absorbed with each transit through the substrate 120.

Figure 1D:
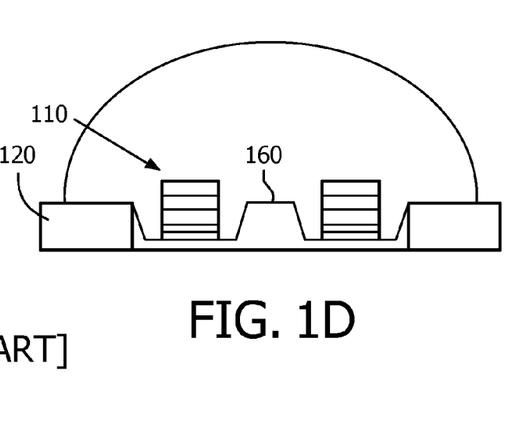

In U.S. Patent Application 2008/0062701, "LIGHT EFFICIENT LED ASSEMBLY INCLUDING A SHAPED REFLECTIVE CAVITY AND METHOD FOR MAKING SAME", filed 29 Aug. 2007 for Harrah et al., a reflective cavity 160 is formed for mounting a plurality of stacks 110 within the light emitting device, as illustrated in FIG. 1D. However, this arrangement does not allow the stack 110 to be mounted on the substrate 120.

It would be advantageous to provide a method for producing a light emitting device with enhanced luminance output. It would also be advantageous to provide such a light emitting device with enhanced luminance output. It would also be advantageous to minimize light loss and/or absorption through the substrate used to mount the light emitting and light conversion elements.

These advantages, and others, can be realized by providing a submount that includes a substrate and a metallization layer having circuit traces and a planar dielectric layer that fills regions between the circuit traces. The planar dielectric layer serves to minimize the amount of light lost/absorbed by the substrate and preferably reflects the internally reflected light back toward the desired light output element. To facilitate efficient manufacture, a dielectric paste is applied over the metallized layer, cured, and then planed to expose at least portions of the metal conductors for the subsequent coupling to the light emitting stack. Pedestal elements are preferably provided at select locations on the circuit traces to facilitate this coupling while allowing the remainder of the circuit traces to be covered with the dielectric layer.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

Copending U.S. patent application Ser. No. 12/508,238, "LED WITH MOLDED REFLECTIVE SIDEWALL COATING" filed 23 Jul. 2009 for Serge Bierhuizen and Gregory Eng, and incorporated by reference herein, discloses molding a layer of dielectric material upon the substrate and up the exterior edges of each light emitting stack to reflect the light from the edges of the stack and the light that is internally reflected within the light emitting device toward the light output surface.

Figure 2A:
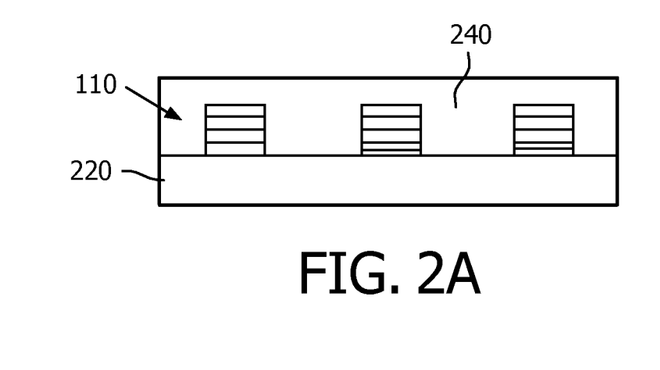
FIGS. 2A-2C illustrate a light emitting device with reflective sidewalls.
Figure 2B:
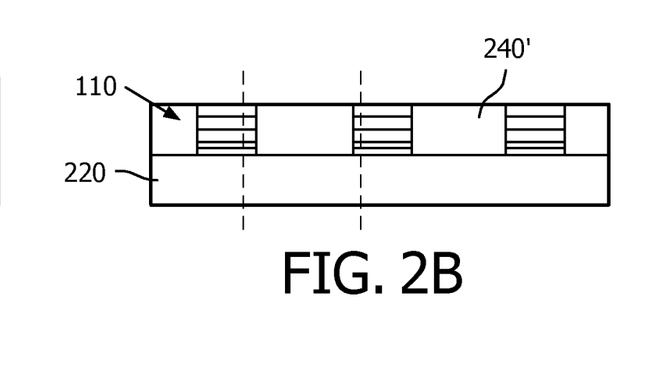
Figure 2C:
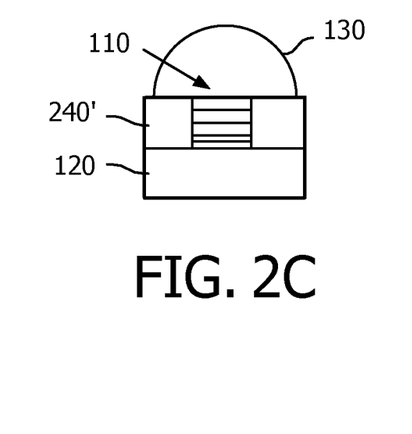

Copending U.S. patent application Ser. No. 12/552,328 "LED PACKAGE WITH PHOSPHOR PLATE AND REFLECTIVE SUBSTRATE", filed 2 Sep. 2009 for Grigoriy Basin, Jeffrey Kmetec, and Paul Martin, and incorporated by reference herein, similarly discloses surrounding the light emitting and conversion stack with reflective material, as illustrated in FIGS. 2A-2C. FIG. 2A illustrates a ceramic tile 220 upon which the stacks 110 are situated during the manufacturing process. In accordance with this copending application, a reflective dielectric 240 is applied atop and around the stacks 110. Thereafter, the dielectric 240 is planed so as to re-expose the top of the stacks 110, as illustrated in FIG. 2B, the planed dielectric being referenced as 240'. Thereafter, the tile is cut/diced into individual substrate elements 120, as illustrated in FIG. 2C. In this manner, each stack 110 is effectively surrounded with reflective material 240', so that light that conventionally escapes from the sides of the stacks, as well as the light that is internally reflected by the lens cap 130 is reflected toward the lens cap 130.

In each of these copending applications, however, reflected light that enters the stack 110 from above may or may not be reflected back toward the lens cap, depending upon whether the light encounters reflective elements, such as metallic circuit traces within the stack. At least some light will likely traverse the entire stack 110 and enter the substrate 120, thereby reducing the luminance efficiency of the light emitting device.

Figure 3A:
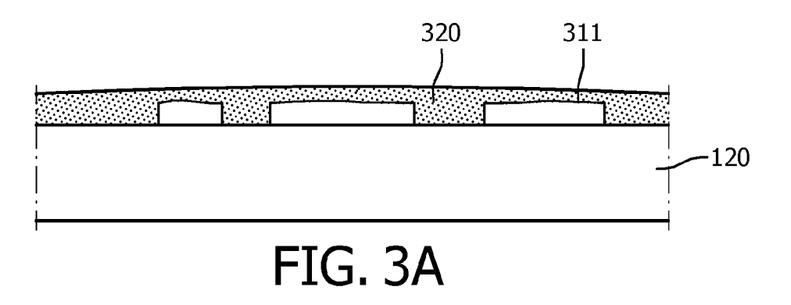
FIGS. 3A-3D illustrate an example fabrication of a light emitting device with a reflective submount.
Figure 3B:
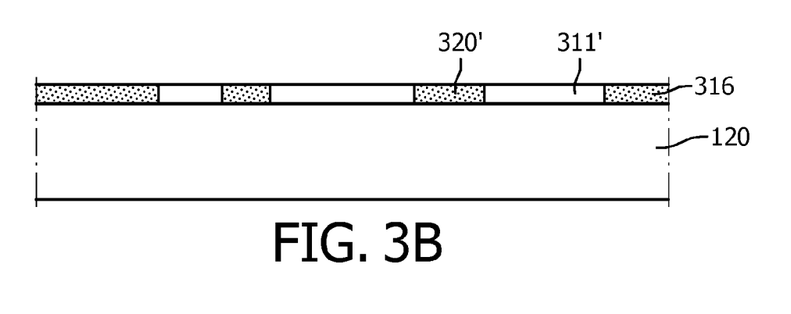

In an embodiment of this invention, a submount for the light emitting stack includes a substrate and a metallization layer having circuit traces and a planar dielectric layer that fills regions between the circuit traces. The planar dielectric layer serves to minimize the amount of light entering the substrate and being absorbed or otherwise lost. FIGS. 3A-3B illustrate an example process for creating such a submount. FIG. 3A illustrates the placement of circuit traces 311 on a substrate 120, typically via a conventional photolithographic process. These circuit traces 311 are typically designed to facilitate external connections to the light emitting device, and are typically applied to a substrate tile upon which multiple light emitting devices are built.

After the circuit traces 311 are formed on the substrate 120, a layer of reflective dielectric material 320 is applied above the circuit traces 311 and at least partially cured. Thereafter, the reflective dielectric material is planed to expose the circuit traces 311. This planing can be accomplished using any of a variety of techniques including grinding, microbead blasting, or other mechanical means.

Preferably the planing process also planes the circuit traces to remove irregularities, to improve their reflective characteristics. As detailed below, the circuit traces may subsequently be plated to further enhance their reflective characteristics. As illustrated in FIG. 3B, the metallization layer 316 comprises the finished dielectric material 320' and the finished circuit traces 311', the surface of each being preferably coplanar with the other for optimal reflectivity. Because the combination of the dielectric material 320' and the circuit traces 311' substantially covers the substrate, light from above the metallization layer is substantially prevented from entering the substrate. The gain in output luminance will be dependent upon the degree of reflectivity of the dielectric material 320' and the circuit traces.

Figure 3C:
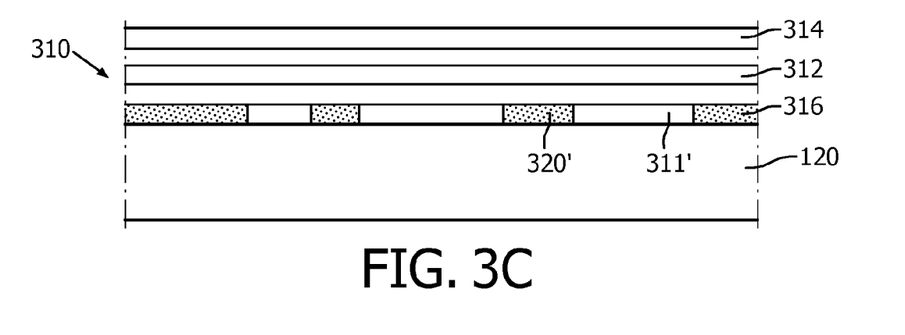

After forming the reflective metallization layer 316, the remaining layers of the light emitting stack 310 may be added, including a light emitting element 312 and, optionally, a wavelength conversion element 314, as illustrated in FIG. 3C. These layers may be deposited directly upon the metallization layer 316, or some or all of these layers may be formed elsewhere, such as on a growth substrate, then attached to the metallization layer 316. Although not illustrated, the intermediate layers of the stack 310 may include circuit traces and vias to connect the electrodes of the light emitting element to the circuit traces 311' in the metallization layer 316.

Figure 3D:
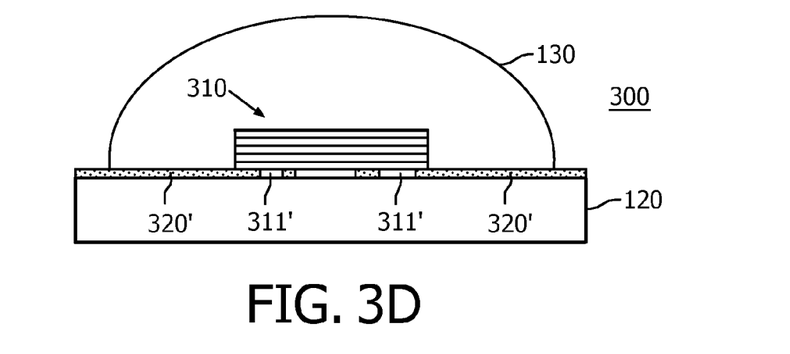

Upon completion of the stack 310, a lens cap 130 may be added; this may be done by molding a transparent silicone or epoxy to the desired shapes over the entire tile. The tile may then be diced to provide the individual light emitting devices 300, as illustrated in FIG. 3D.

Of particular note, the planar dielectric 320' preferably extends between the stacks 310 on the tile, so that when the optional lens cap 130 is formed, the area beneath the lens cap 130 will be reflective. Tests have indicated a luminance increase of about 5% or more may be possible with the addition of the reflective dielectric beneath the stack 310.

Figure 4:
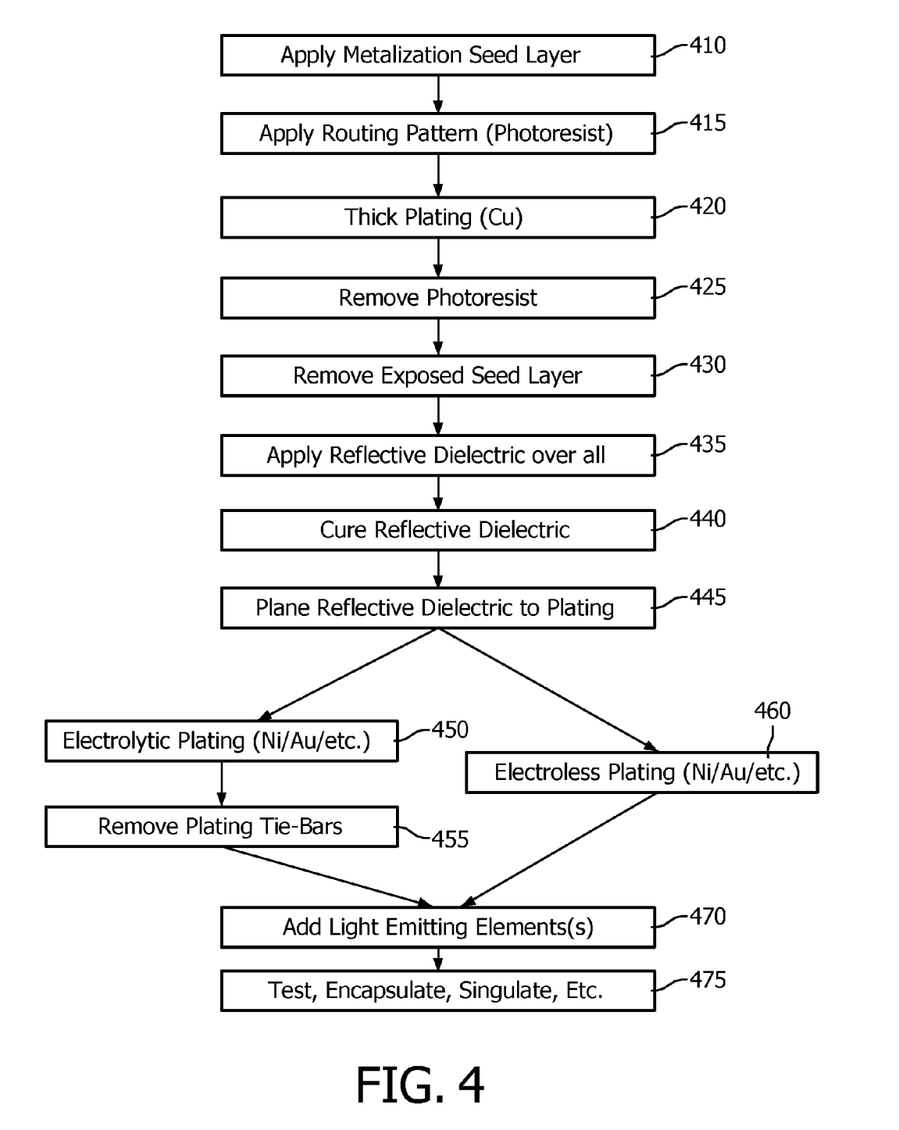
FIG. 4 illustrates an example flow diagram for fabricating a light emitting device with a reflective submount.

FIG. 4 illustrates an example flow diagram for producing a light emitting device with a reflective submount.

At 410, a metallization seed layer is applied to the surface of the substrate upon which multiple light emitting devices may be attached. The substrate may be ceramic, for example alumina or aluminum nitride, but may be formed of other suitable materials, such as semiconductors and anodized conductors. Silicon and anodized aluminum are suitable materials for this substrate.

Upon this metallization layer, a routing pattern for the circuit traces for each submount is formed, at 415, for example, by a photolithographic application of photo-sensitive material. Upon exposing the tile with a pattern of photosensitive material to light and subsequent etching, the patterned circuit traces will be exposed on the substrate.

The seed layer is may be thin, to facilitate its patterning. A thick layer of metal, for example, copper, may then be plated on the exposed circuit traces, at 420. At 425 the photoresist that remains between the circuit traces is removed, thereby exposing the seed layer between the circuit traces. The exposed seed layer is removed, at 430, leaving only the intended circuit traces on the substrate. Other patterning and/or plating techniques and materials may alternatively be used; for example, gold, silver, or solder may be deposited.

At 435, a layer of reflective dielectric material is applied. The dielectric material can be any non-conductive material, preferably with at least about 85% reflectivity. A dielectric, ceramic, or semiconductor material, such as $TiO_2$, $Al_2O_3$, $Y_2O_3$, $ZrO_2$, $SiO_2$, AlN, AlON, GGG, PLZT, PZT, SiAlON, SiC, SiON, YAG, $BaTiO_3$, $SrTiO_3$, diamond, ZnSe, ZnS, ZnTe, $BaSo_3$, cubic zirconium, etc., will generally be suitable, as well as a sol gel of one or more of these compounds, wherein the compound is contained in a host silicate network. In like manner, a particle loaded resin, such as a silicone or epoxy resin with particles of the materials listed above, would also be suitable. Generally, a reflective material can be made by providing a high index contrast between a particle and the host matrix. Similarly, a single material with a high degree of porosity will be reflective, because air has a high index contrast with most solids.

Preferably, the dielectric is applied in slurry form over the entire tile, including atop the circuit traces. The dielectric material is then cured, at 440. At 445, the cured dielectric material is ground or planed so as to be coplanar with the circuit traces. As noted above, the planing may be extended so as to plane the circuit traces as well, thereby providing a uniform surface of high reflectivity.

The circuit traces may be further plated 450, 460 to prevent corrosion, facilitate external connections, and so on. Preferably at least the last layer of plating may provide a reflectivity of at least about 85%. If electrolytic plating is performed, the circuit traces typically include tie-bars that interconnect the multiple devices on the tile that facilitate the electrolytic plating process. If these tie-bars are undesirable in the finished product after dicing, they are removed from the tile after completion of the plating process, at 455. If the device is designed for an electroless plating process to be used, such tie-bars will not be present in the circuit traces.

Upon completion of the plating process, the surface of the substrate tile will preferably be entirely covered with the reflective dielectric and reflective circuit traces, thereby minimizing any loss or absorption of light from the light emitting device through the substrate.

At 470, the remaining layers that form the light emitting element, and optionally, a wavelength conversion element are attached to the submount comprising the substrate and the reflective metallization-dielectric layer. As noted above, some or all of these layers could be formed directly on the submount, or transferred from another process.

At 475, any remaining processing steps, including for example, encapsulation, testing, dicing, and so on, are performed to complete the production of a light emitting device with a reflective submount.

One of skill in the art will recognize that the structure of the reflective submount is not restricted to the example of FIGS. 3A-3D, nor the process of FIG. 4. For example, FIGS. 5A-5D illustrate an alternative that eliminates the planing of circuit traces 511 and provides for a more uniform reflective dielectric layer. Viewline A-A in FIGS. 5C and 5D corresponds approximately to the cross section displayed in FIGS. 5A and 5B, respectively.

Figure 5A:
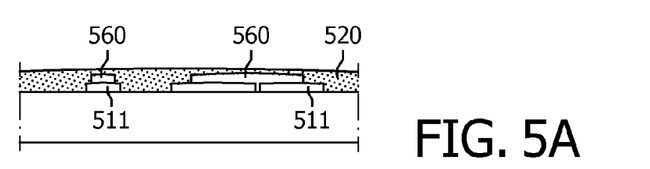
FIGS. 5A-5D illustrate an alternative structure of a light emitting device with a reflective submount.
Figure 5B:
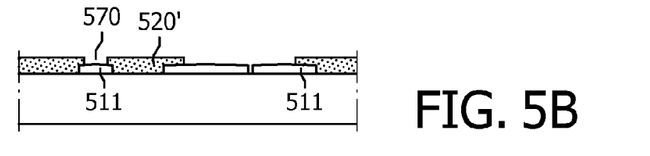

Before the dielectric material 520 is applied over the circuit traces 511, a removable material 560, such as a photo-resist may be applied to select areas on the circuit traces 511. The select areas may be, for example, the contact areas for coupling to external components, and for coupling to the light emitting device. The dielectric material 520 may be applied in slurry form to cover the circuit traces 511 and the removable material 560, as illustrated in FIG. 5A. The dielectric 520 may then be at least partially cured, then planed to just above the circuit traces 511. Thereafter, the removable material 560 may be removed to expose the select areas 570 on the circuit traces 511.

Figure 5C:
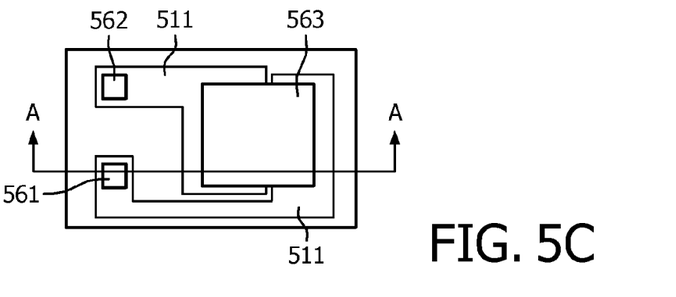

FIG. 5C illustrates the pattern of two circuit traces 511, and three select areas 561, 562, 563 at which the removable material 560 is placed. In this example, the select areas correspond to two contact areas 561, 562, and an area 563 that is large enough to accommodate a light emitting stack.

Figure 5D:
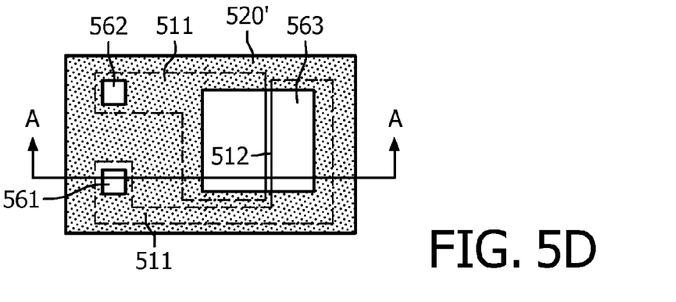

FIG. 5D illustrates the resultant submount after planing the dielectric material 520' and removing the removable material 560. The dielectric material is illustrated with a speckled pattern, and the underlying circuit traces 511 are illustrated with dashed lines. In this example, because the removable material 560 extended across the entire area 563, the space 512 between the circuit traces 511 in this area 563 will not contain dielectric material 520'. Optionally, the removable material 560 in this area 563 could have been partitioned into two areas so as to allow the space 512 to be filled with the dielectric material 520'.

The exposed circuit traces 511 in the areas 561, 562, and 563 can optionally be plated, for example, with nickel or gold to provide corrosion protection and reliable contacts. The plating may be structured so as to provide a coplanar surface with the surface of the dielectric material 520'.

By exposing only the areas 561, 562, and 563, the luminance efficiency can be improved, because the reflectivity, in both angular and spectral domains, of the dielectric layer 520' can be made to be higher than that of the metals used in the circuit traces 511. The cost of a reflective dielectric material can also be substantially lower than the cost of a metal having the same reflectivity; and because the circuit traces 511 are not planed, the amount of metal waste can be substantially reduced.

Of particular note, the circuit traces 511 that are covered with the dielectric layer 520' are protected from the environment, obviating the need to provide a conventional protective plating, such as nickel and/or gold. Because the majority of the area of the circuit traces 511 need not incur the cost of relatively expensive plating metals, the area of the circuit traces 511 can be made to be purposefully large, to facilitate heat transfer and dissipation from the light emitting element.

Figure 6A:
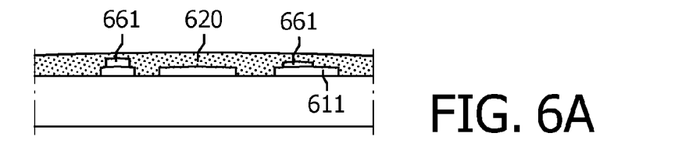
FIGS. 6A-6B illustrate a use of pedestal elements in a reflective submount.
Figure 6B:
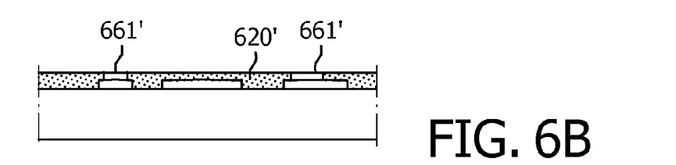

FIGS. 6A-6B illustrate an alternative 'pedestal' structure. As in the above examples, circuit traces 611 are formed on the substrate 120. But in this example, conductive pedestals 661 may be included above the circuit traces 611. These pedestals 661 may be provided, for example, by forming an additional metal layer at select locations of the circuit traces 611, for example, to facilitate coupling to external components, and coupling to the light emitting device. The height of these pedestals 661 may be as small as about five microns above the circuit trace 611, which may be as thick as about fifty microns. The material forming these pedestals may be the same material as the circuit traces 661, or a different conductive material.

As in the above examples, the dielectric material 620 may be applied in slurry form to cover the circuit traces 611 and pedestals 661, at least partially cured, then planed. In this example, the dielectric material is planed down to the level of the pedestal 661, to form a dielectric layer 620' that is coplanar with the surface of the pedestals 661'. Optionally, the exposed pedestals 661' may be further plated to prevent corrosion, improve reflectivity, and so on.

The extended continuous dielectric layer 620' and coplanar pedestals 661' may also provide for a flatter surface for mounting the light emitting stack, which is particularly significant with regard to the mounting of thin-film LEDs, such as TFFC (thin-film flip-chip) LEDs.

With regard to the pedestals 661', because they can be much smaller than the circuit traces, significant savings can be achieved with regard to the use of gold, which is preferably used to facilitate connection reliability, particularly with regard to connection of the light emitting stack.

The foregoing merely illustrates the principles of the invention. It will thus be appreciated that those skilled in the art will be able to devise various arrangements which, although not explicitly described or shown herein, embody the principles of the invention and are thus within its spirit and scope. For example, although the examples illustrate the reflective layer being built as the first layer on the substrate, one of skill in the art will recognize that the reflective layer can be anywhere between the light emitting element and the substrate. However, placing the dielectric on the substrate allows the entire substrate area to be reflectively coated in a single operation. In like manner, although the examples illustrate contacts on the upper surface for coupling to external components, one of skill in the art will recognize that, for example, the substrate 120 may include internal vias, interconnects, and pads that allow for connection to the external components from the bottom of the substrate, obviating the need to place contacts for these connections on the upper surface. These and other system configuration and optimization features will be evident to one of ordinary skill in the art in view of this disclosure, and are included within the scope of the following claims.

In interpreting these claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) each of the disclosed elements may be comprised of hardware portions (e.g., including discrete and integrated electronic circuitry), software portions (e.g., computer programming), and any combination thereof;

f) hardware portions may include a processor, and software portions may be stored on a non-transient computer-readable medium, and may be configured to cause the processor to perform some or all of the functions of one or more of the disclosed elements;

g) hardware portions may be comprised of one or both of analog and digital portions;

h) any of the disclosed devices or portions thereof may be combined together or separated into further portions unless specifically stated otherwise;

i) no specific sequence of acts is intended to be required unless specifically indicated; and j) the term "plurality of" an element includes two or more of the claimed element, and does not imply any particular range of number of elements; that is, a plurality of elements can be as few as two elements, and can include an immeasurable number of elements.

We claim:

1. A method comprising:
    providing a plurality of conductive traces on a metallization layer above a substrate,
    applying a dielectric layer above and between the conductive traces, substantially covering an entire area of the metallization layer above the substrate with the dielectric layer,
    removing a portion of the dielectric layer to facilitate electrical coupling to the plurality of conductive traces, and
    providing a light emitting element above the metallization layer, the conductive traces being electrically coupled to the light emitting element,
    wherein the conductive traces include pedestal elements that are exposed by the removing of the portion of the dielectric layer.

2. The method of claim 1, wherein removing the portion of the dielectric layer includes a planing operation.

3. The method of claim 1, including providing a wavelength conversion element above the light emitting element that is configured to convert at least a portion of light of a first wavelength from the light emitting element to light of a second wavelength.

4. The method of claim 1, wherein the conductive traces beyond the pedestal elements are not exposed by the removing of the portion of the dielectric layer.

5. The method of claim 1, wherein the dielectric layer includes at least one of a ceramic and semiconductor.

6. The method of claim 1, wherein the dielectric layer includes at least one of a ceramic and semiconductor within a host silicate network.

7. The method of claim 1, wherein the dielectric layer includes at least one of a ceramic and semiconductor within one of an epoxy, silicone, and sol-gel resin.

8. The method of claim 1, wherein the dielectric layer includes particle elements in a matrix, wherein reflectivity is provided via an index contrast between the particle elements and the matrix.

9. The method of claim 1, including plating of at least a portion of the conductive traces.

10. The method of claim 1, wherein the dielectric layer is reflective and substantially covers an entirety of surface area of the substrate.

11. A method comprising:
    providing a plurality of conductive traces on a metallization layer above a substrate,
    applying a dielectric layer above and between the conductive traces,
    removing a portion of the dielectric layer to facilitate electrical coupling to the plurality of conductive traces,
    providing a light emitting element above the metallization layer, the conductive traces being electrically coupled to the light emitting device
    providing removable elements at select locations on the circuit traces before applying the dielectric layer above the removable elements, wherein the removing of the portion of the dielectric is configure to expose the removable elements, and
    removing the removable elements to facilitate the electrical coupling to the plurality of conductive traces.

12. The method of claim 11, wherein the conductive traces beyond the removable elements are not exposed by the removing of the removable elements.

13. A light emitting device comprising:
    a submount that includes a substrate and a metallization layer that includes circuit traces and a planar dielectric layer that fills regions between the circuit traces and substantially covers an entire area of the metallization layer except for contacts to the circuit traces, and
    a multi-layer stack upon the submount, the stack including a light emitting element that is coupled to the metallization layer via the contacts
    wherein the circuit traces include pedestal elements that extend above a plane formed by the circuit traces beyond the pedestal elements, the dielectric layer being substantially coplanar with an upper surface of the pedestal elements.

14. The device of claim 13, wherein the dielectric layer covers a substantial portion of the circuit traces.

15. The device of claim 13, wherein the dielectric layer is reflective and substantially covers an entirety of surface area of the submount.

16. The device of claim 13, including a wavelength conversion element above the light emitting element that is configured to convert light of a first wavelength emitted by the light emitting element into light of a second wavelength.

17. The device of claim 13, wherein the dielectric layer includes at least one of a ceramic and semiconductor.

18. The device of claim 13, wherein the dielectric layer includes at least one of a ceramic and semiconductor within a host silicate network.

19. The device of claim 13, wherein the dielectric layer includes at least one of a ceramic and semiconductor within one of an epoxy, silicone, and sol-gel resin.

20. The device of claim 13, wherein the dielectric includes particle elements in a matrix, wherein reflectivity is provided via an index contrast between the particle elements and the matrix.

21. The device of claim 13, wherein at least a portion of the conductive traces are plated with at least one of nickel and gold.

* * * * *